United States Patent
Lu et al.

[11] Patent Number: 6,055,190
[45] Date of Patent: Apr. 25, 2000

[54] DEVICE AND METHOD FOR SUPPRESSING BIT LINE COLUMN LEAKAGE DURING ERASE VERIFICATION OF A MEMORY CELL

[75] Inventors: Wenpin Lu, I-Lan; Ying-Che Lo, Tainan; Ming-Jye Chiou, Miaoli; Mam-Tsung Wang, Hsinchu, all of Taiwan

[73] Assignee: Macronix International Co., Ltd., Hsinchu, Taiwan

[21] Appl. No.: 09/268,557

[22] Filed: Mar. 15, 1999

[51] Int. Cl.[7] .................................................. G11C 16/06
[52] U.S. Cl. .............................. 365/185.22; 365/185.18; 365/185.3; 365/185.29
[58] Field of Search .................. 365/185.22, 185.18, 365/185.3, 185.01, 185.29

[56] References Cited

U.S. PATENT DOCUMENTS

| | | | |
|---|---|---|---|
| 5,218,571 | 6/1993 | Norris | 365/189.09 |
| 5,396,459 | 3/1995 | Arakawa | 365/185 |
| 5,416,738 | 5/1995 | Shrivastava | 365/185 |
| 5,457,652 | 10/1995 | Brahmbhatt | 365/185.06 |
| 5,467,306 | 11/1995 | Kaya et al. | 365/185.2 |
| 5,467,310 | 11/1995 | Yoshida et al. | 365/185.07 |
| 5,537,362 | 7/1996 | Gill et al. | 365/233.5 |
| 5,557,569 | 9/1996 | Smayling et al. | 365/185.28 |
| 5,574,686 | 11/1996 | Watsuji et al. | 365/185.23 |
| 5,581,502 | 12/1996 | Richart et al. | 365/185.26 |

*Primary Examiner*—David Nelms
*Assistant Examiner*—Hoai V. Ho
*Attorney, Agent, or Firm*—Haynes & Beffel LLP

[57] ABSTRACT

A device and method of operation for an improved erase-verify device in which the non-selected cells, within a bit line column of an array of cells, remain inactive. Only the active cell is verified with minimum bit line column leakage associated with the operation of erase verification. Erase verification for a memory array is achieved by applying a source voltage (generally positive) to the common source line associated with a column of cells in the array. This will raise the threshold voltages of the cells (through the body effect of the semiconductor device) to a level higher than the predetermined minimum erased threshold voltage. The non-selected wordlines are coupled to a reference level below the threshold level of the cell (e.g. ground), and the selected wordline is coupled to a positive voltage which is a function of the source voltage. The source voltage is also added to the drain source voltage. The source voltage thereby serves as a feedback input to both the wordline and bit line inputs. Thereafter, a fixed drain-to-source bias is applied to the selected bit line column to conduct current for verification of the cell. The source voltage feedback allows the wordline voltage to be adjusted so that read current through the selected cell can be maintained at a desired level. Using this approach, the bit line column leakage caused by over-erased cells can be effectively suppressed, and an accurate verification result can be achieved.

20 Claims, 5 Drawing Sheets

DEVICE AND METHOD FOR SUPPRESSING BIT LINE COLUMN LEAKAGE DURING ERASE VERIFICATION OF A MEMORY CELL

BACKGROUND OF THE INVENTION

1. Field of the Invention

The present invention relates to a device and method for suppressing the bit line column leakage current in an array of memory cells during erase verification operations.

2. Description of Related Art

Recently, non-volatile semiconductor memory devices, including for instance EEPROMs (Electrically Erasable Programmable Read Only Memories) and EPROMs (Erasable Programmable Read Only Memories) have been widely used in computer, communication and consumer electronic products. Conventional EEPROMs require two transistors per cell, and generally require a relatively large area per cell. These drawbacks result in higher fabrication costs, and make for a larger overall device. EPROMs have the advantage of using one transistor per cell and are therefore relatively cheaper to fabricate and smaller in size. Flash EPROMs provide for convenient electrical erasure of the entire memory array or blocks of the array. Flash EPROMs whose cell area is similar in size to that of traditional EPROMs have become more popular for high density memory applications.

A conventional flash EPROM memory array generally uses a single transistor with stacked polysilicon gates (e.g. a floating gate and control gate) for each cell within the array. The transistor is formed on a p-type well, having n-type source and drain regions provided within the well. The act of programming a flash EPROM cell can take many forms. One popular approach involves injecting the floating gate of selected cells with electrons which thereby places a net negative charge upon the floating gate and increases the turn-on threshold voltage of the memory cell. As a read voltage is applied to the control gates of the programmed cells, the cells will remain non-conductive and not "turn-on." The act of erasing a flash EPROM cell having a negatively charged floating gate involves removing electrons from the floating gate to lower the threshold voltage. With a lower threshold voltage, the cell will turn on to a conductive state when addressed with a read voltage at the control gate.

During the erase operation, over-erasure occurs if too many electrons are removed from the floating gate, thereby leaving a net positive charge. This positive charge biases the memory cells slightly on, so that a small current may conduct through the channel of the memory cell even when it is not addressed. A number of over-erased cells along a given bit line column can cause an accumulation of leakage current sufficient to induce a false reading. In addition, the leakage current can cause an inaccurate erase verification result if there are any over-erased cells co-existing with a "slow bit" on the same bit line column. A "slow bit" is a cell which is difficult erase, or in other words a cell which proves difficult to lower its threshold voltage below a predetermined maximum value.

Referring now to FIG. 1, a prior art circuit diagram 100 is shown which illustrates bias conditions for a conventional erase-verify scheme in which an erroneous erase verification is caused by the over-erased cells. Cell B is representatively designated as a slow bit which is under the necessary limits for erase verification. In this instance, for a read operation, the wordline (Vwl) of cell B is biased at a verify voltage which generally equals the Vcc level for the circuit 100. The wordlines (Vwl) of the other cells on the same bit line column (e.g. cells A, C, and D) are connected to ground (GND). Under these biasing conditions, if cell D is over-erased, a common result will be that its threshold voltage Vt is negative. With such a negative Vt, a leakage current from cell D will contribute to the bit line current and may result in an erase verification "pass" for cell B.

Erase verification pass generally means that all of the cells in a sector, or in the whole chip, pass the erase verification process. A commonly used procedure after erase verification involves taking steps to compensate for (or recover) the threshold voltage of over-erased cells by "soft-programming." Referring now to FIG. 2, an example flow-chart is shown of steps used for soft programming. Step 200 starts the process with step 202 including the pre-programming operations. In step 204 an erasing pulse is sent to a sector of cells (or the whole chip). Each cell is then verified in step 206 to see if the cell "passed." If the cell passes (i.e. the answer is "yes"), then soft programming 208 is applied and the procedure ends 210. If the cell fails (i.e. the answer is "no"), then further erasing pulses 204 are applied to achieve erasure of the cells. In general, soft-programming will not be applied unless all of the cells in a sector, or in the whole chip, pass erase verification.

Referring now to FIG. 3, a schematic diagram is shown of the threshold voltage distribution of cells after the erasure operation. This diagram plots the Threshold Voltage on the horizontal axis versus the cell number in an array of cells (having that threshold voltage) on the vertical axis. The resultant plot 300 shows the distribution of threshold voltages for the cells within an array. Most of the cells have threshold voltages which are in the desired region between Vt_min and Vt_max. However, some of the cells 302 are not in the desired region, and instead are in the over-erased region below Vt_min. Among these over-erased cells, certain soft-programming techniques can be applied in order to "recover" the cell so that it has a threshold voltage higher than Vt_min. However, certain "slow bits" 304 still exist. Slow bits are cells which have threshold voltages above the erasing decision level 306 (at Vt_max). Such slow bits 304 will cause failure during the read operation, including false verifications.

To address problems such as false verifications, prior art solutions have been configured to reserve more decision margin (e.g. room below Vt_max) for cell B during the read operation. One conventional method includes lowering the wordline voltage on the selected cell for erase verification. Referring now to FIG. 4, a modified erase-verify circuit configuration 400 is shown in which the wordline voltage 402 applied to the selected cell B is Vcc minus a delta voltage margin amount, i.e. ΔVmgn. This scheme is not preferred, however, as it is difficult to determine the necessary value of ΔVmgn (which primarily depends upon the maximum bit line column leakage). Still another issue regarding the reduction of the wordline voltage (or verify voltage) is that the erased threshold voltages of memory cells in a sector (or in the whole chip) will be smaller than they would be if a normal verify voltage is used. The smaller erased threshold voltages may induce more over-erased cells.

As yet another solution, if a configuration can be made to effectively suppress the bit line column leakage caused by the over-erased cells, then more accurate verification results can be achieved. Referring now to FIG. 5, a device configuration 500 is shown which realizes the suppression of bit line column leakage. In the example, the wordline of the selected cell B has a voltage Vcc applied. The non-selected cells A, C, and D (and so forth) have a negative voltage (for example −V, or −Vcc). If all of the over-erased cells on the same bit line column with cell B can be turned off effectively, then the drain current detected by an associated sense amplifier is coming only from cell B. However, implementation of this approach may be complicated since it is necessary to use a negative charge pump for supplying the negative wordline voltage. Examples of prior art using negative wordline voltages include: U.S. Pat. Nos. 5,396,459; 5,416,738; 5,537,362; 5,557,569; 5,574,686; and 5,581,502. Other art includes U.S. Pat. No. 5,547,652 which uses a negative voltage on the non-selected wordline during certain programming operations, and also during erase operations. In yet another approach, U.S. Pat. No. 5,467,310 discloses a configuration where the source of the active cell is connected to a first level, and the sources of the non-active cells are connected to a power supply (or second level) to insure deactivation.

Accordingly, an improved solution is needed to prevent false readings during erase-verify operations, as caused by over-erased cells in an array memory cells. In particular, the solution would be advantageous if applicable to the desirable flash EPROM cells. The improved erase-verify scheme should be easier to implement, yet should insure inactivity of the non-selected cells during read operations. In particular, the scheme should not require unnecessary hardware overhead, or necessitate a negative voltage on the wordlines of the non-selected memory cells.

SUMMARY OF THE INVENTION

The present invention provides a device and method of operation an improved erase-verify device configuration in which the non-selected cells, within a bit line column of an array of cells, remain inactive. Only the active cell is verified with minimum bit line column leakage associated with the operation of erase verification. Erase verification for a memory array is achieved by applying a source voltage (generally positive) to the common source line associated with a column of cells in the array. This will raise the threshold voltages of the cells (through the body effect of the semiconductor device) to a level higher than the predetermined minimum erased threshold voltage. The non-selected wordlines are grounded, and the selected wordline is coupled to a positive voltage which is a function of the source voltage. The source voltage is also added to the drain source voltage. The source voltage thereby serves as a feedback input to both the wordline and bit line inputs. Thereafter, a fixed drain-to-source bias is applied to the selected bit line column to conduct current for verification of the cell. The source voltage feedback allows the wordline voltage to be adjusted so that read current through the selected cell can be maintained at a desired level. Using this approach, the bit line column leakage caused by over-erased cells can be effectively suppressed, and an accurate verification result can be achieved.

Accordingly, one aspect of the present invention is to provide suppression of bit line column leakage in a memory cell array, without the need for complicated hardware overhead.

Still another aspect of the present invention is to provide a memory cell array wherein a source bias is applied to the common source line of a column of memory cells in an array. The threshold voltages of the cells will be increased due to body effect, and non-selected cells will contribute less leakage current on the bit line.

A related aspect of the present invention is to provide an erase-verify scheme wherein an accurate verification result can be achieved by applying a biasing voltage to the source line, and also by providing the biasing voltage as a feedback element to the bit line voltage and the wordline voltage of the selected memory cell.

Still another aspect of the present invention is to provide an erase-verify scheme wherein the source bias is added to a drain voltage, and the wordline voltage is a function of the source bias.

Yet another aspect of the present invention is to provide an erase-verify scheme wherein the wordline voltage function provides for adjustment of the wordline voltage so that a desired drain (or read) current is maintained through the selected memory cell.

A related aspect of the present invention is to provide a wordline voltage function having a linear relationship to the source bias (Vs) via the formula: $a+b*Vs$, wherein the constants "a" and "b" are selected to maintain the desired read current during erase verification.

Other aspects and advantages of the present invention can be seen upon review of the figures, the detailed description, and the claims which follow.

DETAILED DESCRIPTION

A detailed description of the preferred embodiments of the present invention is provided with reference to FIGS. 1–9. FIGS. 1–5 (described above) illustrate prior art configurations and resulting data plots. FIGS. 6–9 include circuit diagrams, blocks diagrams, and data plots showing the present invention and advantages thereof.

Figure 1:
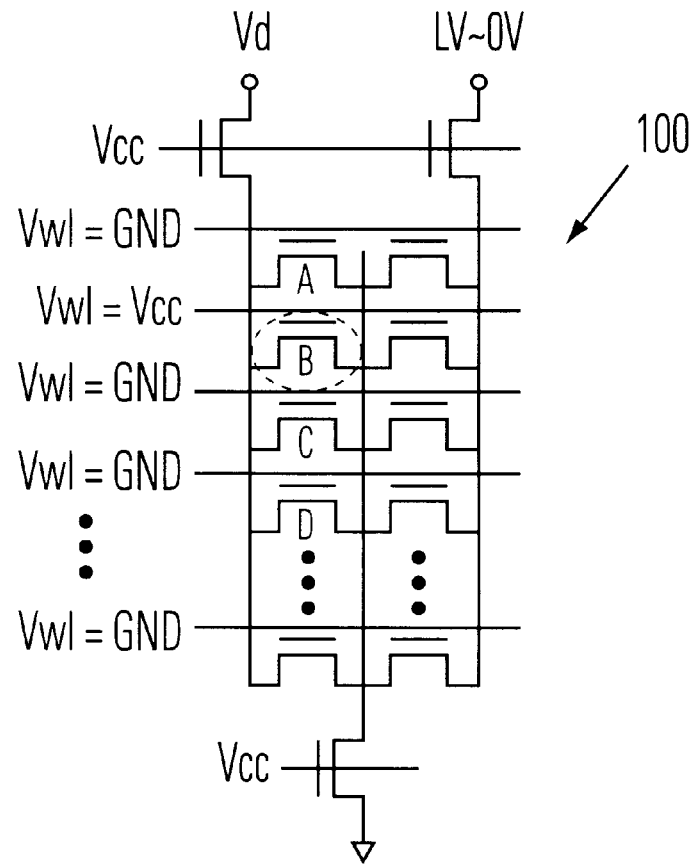
FIG. 1 is a prior art circuit configuration showing biasing conditions for a conventional erase-verify scheme.
Figure 2:
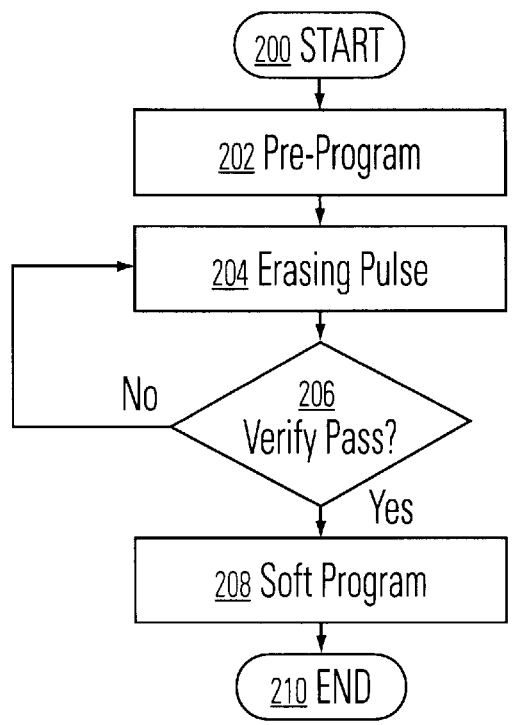
FIG. 2 is a prior art flow chart for a conventional erase-verify procedure where the erase verification is done after each erasing pulse.
Figure 3:
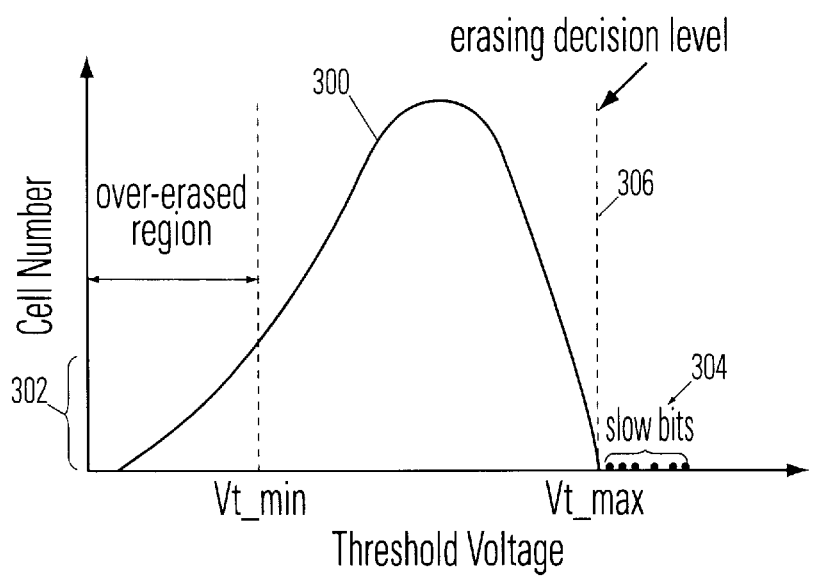
FIG. 3 is a prior art schematic diagram showing the threshold distribution of cells after an erase operation.
Figure 4:
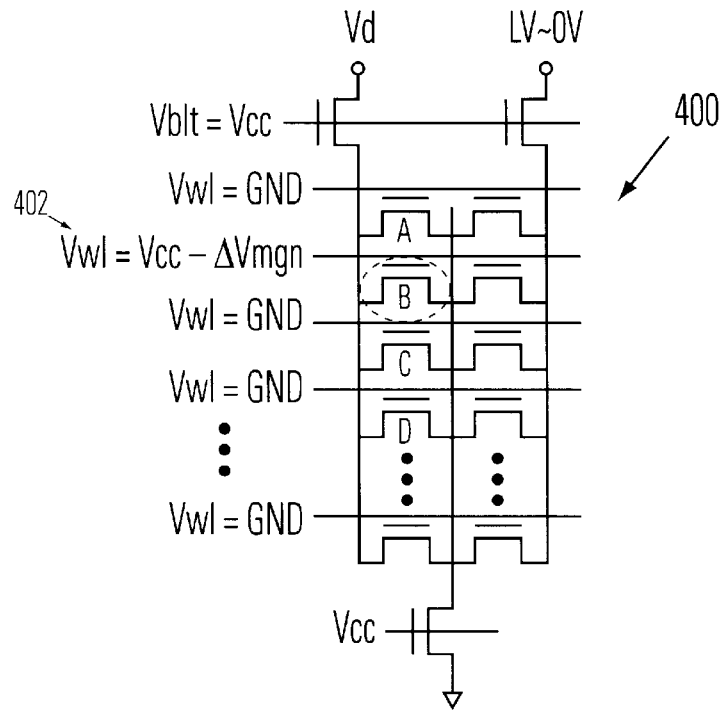
FIG. 4 is a prior art circuit configuration showing a modified erase-verify scheme to provide more margin for the prevention of false cell verifications.
Figure 5:
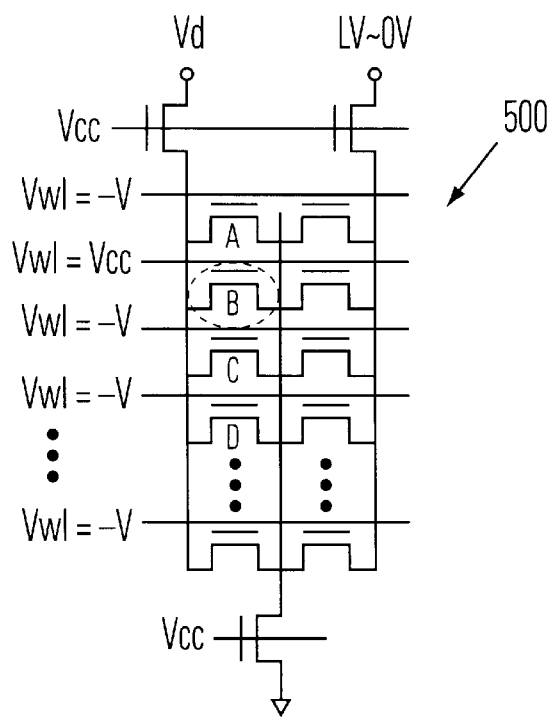
FIG. 5 is a prior art circuit configuration showing a wordline inhibit voltage applied to non-selected cells.
Figure 6:
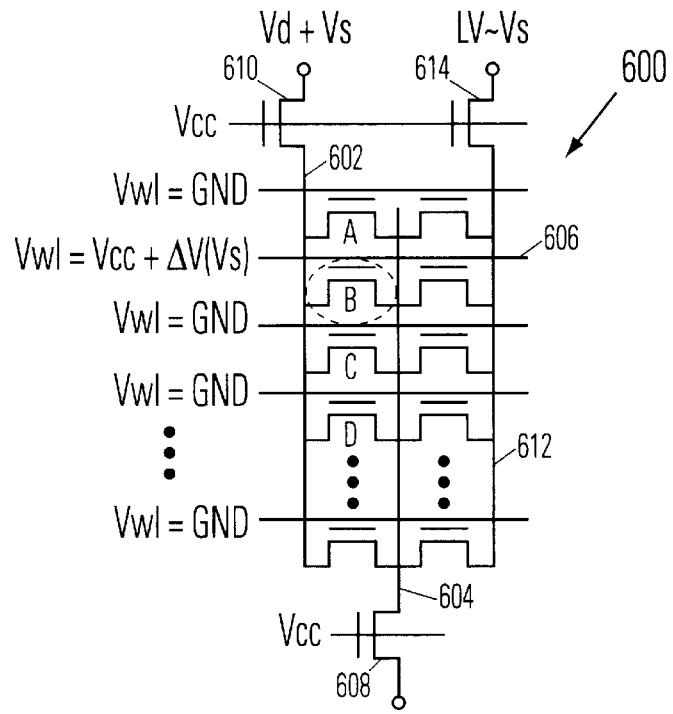
FIG. 6 is a circuit configuration showing the approach of the present invention for suppression of bit line column leakage by applying a source bias, and portional source bias amounts on the drain line and selected wordline.

FIG. 6 is a circuit diagram 600 showing a portion of a memory array configuration which has been biased according to the present invention in order to provide suppression of the bit line column leakage for non-selected cells. As before with FIGS. 1, 4 and 5, the memory cells A through D are arranged in columns which are selectable via common bit line 602 and common source line 604. Each row of cells is selectable via common wordlines, for example wordline 606 for cell B. In this instance, cell B is the selected cell for an erase-verify operation, and cells A, C, and D are the non-selected cells. A source pulldown device 608 is applied to the common source line 604. While a variety of pulldown devices might be used, a transistor device 608 is used with an applied gate voltage of Vcc. A source voltage Vs is used to provide a source bias to the drain of the transistor device 608. A transistor device 610 having a gate voltage Vcc is also coupled to the common bit lines 602. The source of the device 610 is coupled to a drain voltage Vd plus the source voltage Vs. The wordlines of the non-selected cells A, C and D are coupled to a reference level, such as ground (e.g. Voltage wordline, or Vwl=GND). The reference level might also include a wordline voltage less than the threshold voltage of that particular cell. The wordline 602 of the selected cell B is coupled to a voltage Vcc plus a delta amount which is a function of the source voltage Vs. The non-selected bit line column 612 is also coupled to the source voltage Vs through transistor device 614. In the prior configurations (FIGS. 1, 4 and 5) the non-selected bit line columns were coupled to 0 volts. Accordingly, all of the cells in the whole chip, or in a particular sector, including the selected and non-selected cells experience the source voltage. Consequently, the threshold voltages of these cells will be increased due to the body effect in the semiconductor device.

Figure 7:
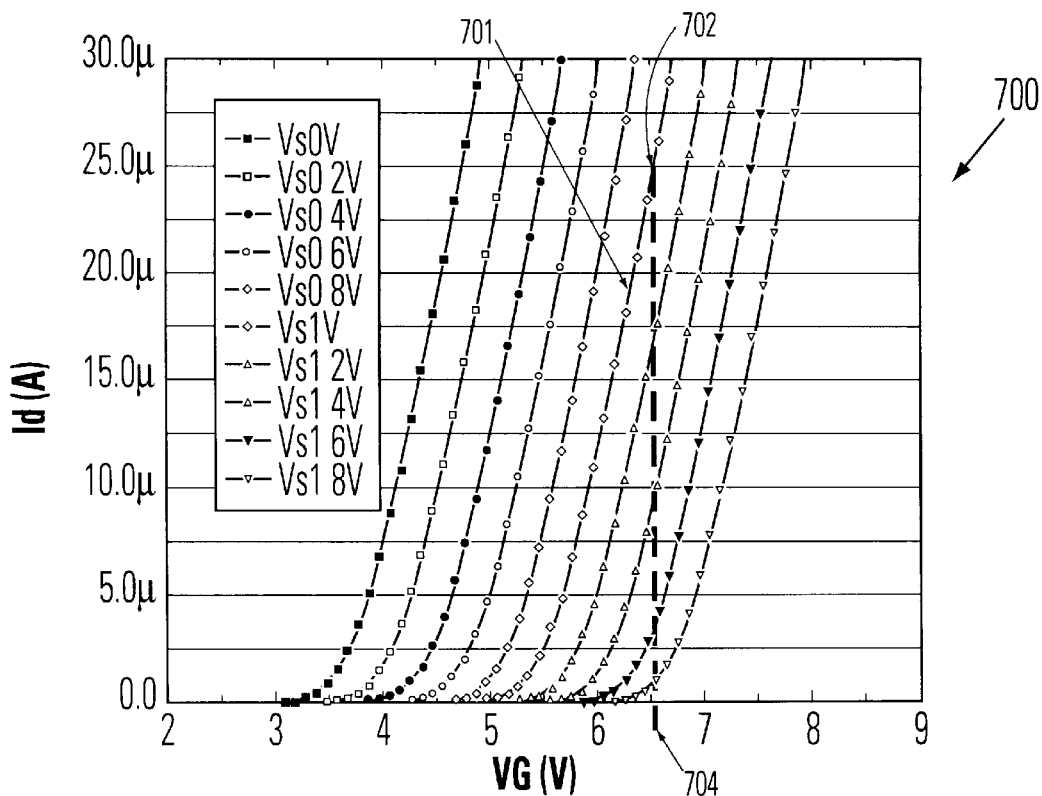
FIG. 7 is a plot of drain current as a function of wordline voltage under different source bias conditions.

Referring now to FIG. 7, a plot 700 is shown of the typical drain current (Id in amps, A) as a function of wordline voltage (Vg in volts, V) under different source bias conditions for a memory cell device. In this instance, the drain-to-source voltage is fixed at 1 volt during erase verification. An increase in the source bias results in a decrease in the drain current under the same wordline voltage. This means that as the source bias is increased to suppress the bit line column leakage caused by the non-selected cells, the wordline voltage for the selected cell should be increased to retain the same read current for erase verification. For example, if a predetermined verify current is 25 microamps (uA), then the relationship between the wordline and source bias (Vs) can be computed as: Vg at 25 uA=4.84+1.68×Vs. Applying this to the plot line 701 for Vs=1V, the data point 702 at 25 uA is shown to have a Vg of 6.52 V, as shown by the horizontal intersection point 704. At such levels, the wordline voltage Vg needs to be larger than the conventional power supply voltage Vcc (e.g. typically 5–6 volts). This becomes even more pronounced at higher Vs levels. Accordingly, the wordline voltage should be supplied from a charge pump associated with the memory circuit. Compared to a conventional read operation, the erase verification time is long enough to account for any setup time for the charge pump.

Figure 8:
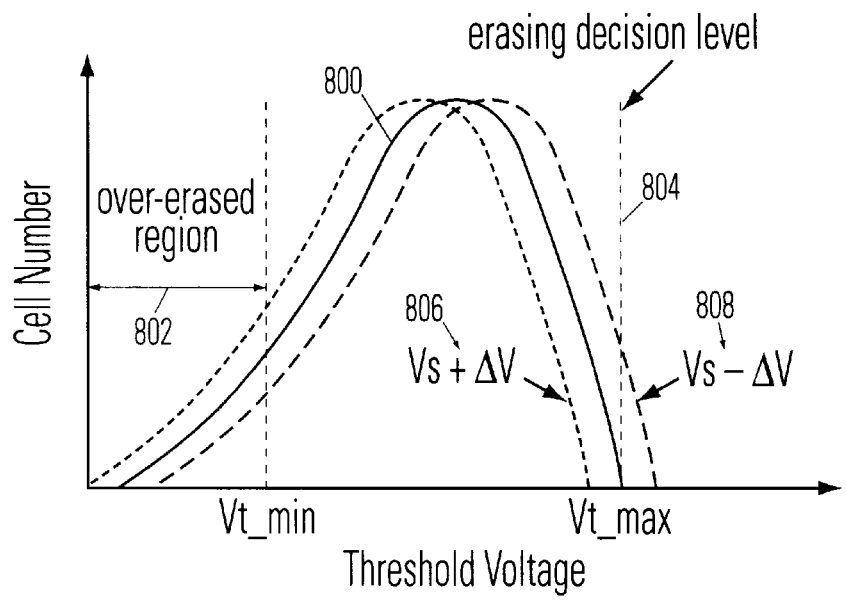
FIG. 8 is a schematic diagram of the threshold distribution of cells showing the effects of variations in the source bias upon the threshold distribution.

An additional issue, which should be considered in the implementation of the present source biasing scheme, is the possible variation of the source voltage during erase verification. Referring now to FIG. 8, a plot is shown which is similar to that of FIG. 3. Again the threshold voltage distribution 800 is shown for various cells within the array, with the threshold voltage plotted on the horizontal axis and the cell number plotted on the vertical axis. The Vt_min level is shown whereby cells with a threshold voltage below Vt_min are cells in the over-erased region 802. Vt_max is shown defining the erasing decision level 804. As the source bias is increased due to Vcc and/or the process variation, the drain current consisting of the read current of the selected cell and the leakage current of the non-selected cells will reduce. Under this condition, the verification result would fail. Hence, it becomes necessary to apply yet another erasing pulse to the selected sector, or the whole verification chip, until all of the cells pass the erase verification (see FIG. 2). The additional erasing pulses will make the erased threshold voltages lower than expected, as shown by plot 806 (Vs+$\Delta$V). This will induce more over-erased cells in the over-erased region 802 and will likely cause failure in the subsequent soft-programming step (see again FIG. 2).

If the source bias is decreased, then the drain current will be increased. In such a case, the resulting plot 808 (Vs–$\Delta$V) is shown. As the curve is now shifted forward along the horizontal axis, more of the erased cells will pass the erase verification and not fall within the over-erased region 802. An increased number of cells, however, will have a threshold voltage which falls beyond the predetermined max value (Vt_max). As a result, there will be an increased number of slow bits (e.g. cells having a threshold voltage falling beyond the range of Vt_max). The presence of such slow bits can lead to subsequent failure during the read operation.

Figure 9:
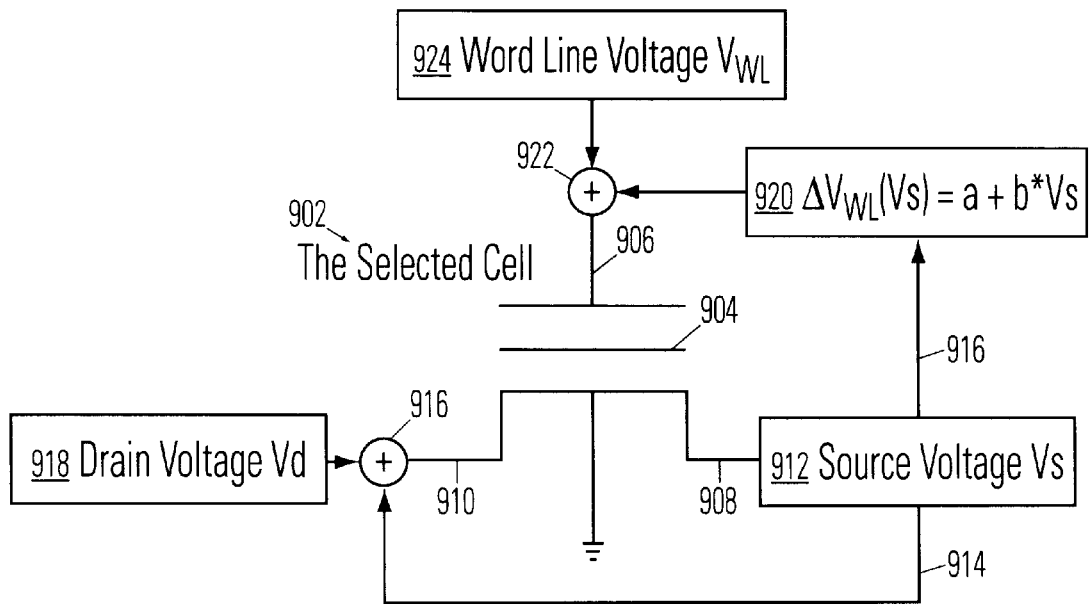
FIG. 9 is a functional block diagram of the present configuration showing the source voltage Vs being used as a feedback element to the drain voltage (of the column) and wordline voltage (of the selected cell).

To eliminate the influence of such source bias variations on the erased threshold voltage distribution, the source bias feedback scheme of the present invention can be used. Referring now to FIG. 9, a block diagram 900 is shown of the feedback configuration. The selected cell (shown as a floating gate cell) 902 is shown with a floating gate 904, control gate 906, source line 908, and drain line 910. A source voltage Vs is shown as block 912 coupled to source line 908. A feedback line 914 couples Vs to a summation device 916 at the drain line 910. The source voltage Vs is added to a drain voltage Vd as shown by block 916. The source voltage is also provided as a feedback input via line 916 into a wordline voltage term 920 which is a function of Vs. While a variety of functions would provided the necessary relationship with the source voltage Vs, the preferred embodiment utilizes the formula $\Delta$Vwl(Vs)=a+b*Vs. The wordline voltage Vwl as shown by block 924 is added to the term $\Delta$Vwl via the summation device 922 as coupled to the control gate 906. As such, both the wordline and bit line voltages have separate feedback paths from the source voltage Vs. As shown above in relation to FIG. 7, the values for the constants "a" and "b" in the term $\Delta$Vwl are computed as dependant upon the desired drain current (or read current) through the selected cell. By using this approach, a source biased erase-verify scheme is provided which is simple and reliable to implement in flash EPROMs and the like.

The foregoing description of preferred embodiments of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A memory cell device for performing erase-verify operations on a selected memory cell in an array of memory cells, the array arranged in columns which are switchably selectable via bit lines and source lines common to cells in a particular column, and rows which are switchably selectable via wordlines, the device comprising:

a biasing source applied to the common source line of a selected memory cell and associated non-selected memory cells in the array;

a drain voltage and the biasing source applied to the common bit line of the selected memory cell and associated non-selected memory cells in the array;

a wordline voltage applied to the wordline of the selected memory cell, the wordline voltage being a function of the biasing source;

a reference potential applied to the wordlines of the non-selected memory cells.

2. The memory cell device of claim 1, wherein the reference potential is a wordline voltage less than the threshold voltage of the non-selected cells.

3. The memory cell device of claim 1, wherein the reference potential is ground.

4. The memory cell device of claim 1, wherein the biasing source includes a source voltage.

5. The memory cell device of claim 4, wherein the memory cell device further includes a summation device for adding the source voltage to the drain voltage, the summation result being applied to the bit line of the selected memory cell.

6. The memory cell device of claim 5, wherein the memory cell device further includes a summation device for adding the wordline voltage to a voltage term which is a function of the source voltage, the summation device result being applied to the wordline of the selected memory cell.

7. The memory cell device of claim 6, wherein the voltage term includes a first constant multiplied by the source voltage with the product added to a second constant.

8. The memory cell device of claim 6, wherein the source voltage is set at a level to suppress the bit line column leakage caused by the non-selected memory cells.

9. The memory cell device of claim 7, wherein the constants are selected to maintain a constant read current through the selected memory cell.

10. A device for performing erase-verify operations on a selected memory cell in an array of memory cells, the array arranged in columns which are switchably selectable via bit lines and source lines common to cells in a particular column, and rows which are switchably selectable via wordlines, the device comprising:

means for biasing the common source line of a selected memory cell and associated non-selected memory cells in the array;

means for adding the bias to a drain voltage coupled to the common bit line of the selected memory cell and associated non-selected memory cells in the array;

means for adjusting a wordline voltage coupled to the wordline of the selected memory cell;

means for coupling the wordlines of the non-selected memory cells to a reference level.

11. The device of claim 10, wherein the wordline voltage is a function of the biasing applied to th non source line.

12. A method for performing erase-verify operations on a selected memory cell in an array of memory cells, the array arranged in columns which are switchably selectable via bit lines and source lines common to cells in a particular column, and rows which are switchably selectable via wordlines, the method comprising steps of:

applying a biasing source to the common source line of a selected memory cell and associated non-selected memory cells in the array;

applying a drain voltage and the biasing source to the common bit line of a selected memory cell and associated non-selected memory cells in the array;

applying a wordline voltage to the wordline of the selected memory cell, the wordline voltage being a function of the biasing source;

applying a reference level to the wordlines of the non-selected memory cells.

13. The method of claims 12, wherein the reference level is less than the threshold voltage of the non-selected memory cells.

14. The method of claim 12, wherein the reference level is ground.

15. The method of claim 12, wherein the biasing source includes a source voltage.

16. The method of claim 15, wherein the memory cell device further includes a summation device for adding the source voltage to the drain voltage, the summation result being applied to the bit line of the selected memory cell.

17. The method of claim 16, wherein the memory cell device further includes a summation device for adding the wordline voltage to a voltage term which is a function of the source voltage, the summation device result being applied to the wordline of the selected memory cell.

18. The method of claim 17, wherein the voltage term includes a first constant multiplied by the source voltage with the product added to a second constant.

19. The method of claim 18, wherein the source voltage is set at a level to suppress the bit line column leakage caused by the non-selected memory cells.

20. The method of claim 18, wherein the constants are selected to maintain a constant read current through the selected memory cell.

* * * * *